United States Patent [19]

Loper, Jr.

[11] 4,149,260
[45] Apr. 10, 1979

[54] ANALOG TO DIGITAL CONVERTER FOR PROVIDING THE DIGITAL REPRESENTATION OF AN ANGLE

[75] Inventor: Edward J. Loper, Jr., Santa Barbara, Calif.

[73] Assignee: General Motors Corporation, Detroit, Mich.

[21] Appl. No.: 833,065

[22] Filed: Sep. 14, 1977

[51] Int. Cl.² .................. G06G 7/22; H03K 13/02
[52] U.S. Cl. ........................ 364/817; 340/347 NT; 340/347 SY; 364/603; 364/830; 340/347 AD
[58] Field of Search .............. 364/817, 818, 829, 830, 364/850, 603, 605, 606, 834; 340/347 NT, 347 SY, 347 AD

[56] References Cited

U.S. PATENT DOCUMENTS

| Re. 28,833 | 5/1976 | Dorey | 340/347 NT |
|---|---|---|---|
| 3,839,716 | 10/1974 | Reichnebacher | 340/347 SY |
| 3,896,431 | 7/1975 | Dickinson | 340/347 NT |
| 3,930,252 | 12/1975 | Storar | 340/347 NT |
| 4,024,533 | 5/1977 | Neumann | 340/347 NT |
| 4,031,533 | 6/1977 | Neumann | 340/347 NT |

Primary Examiner—Joseph F. Ruggiero
Attorney, Agent, or Firm—Albert F. Duke

[57] ABSTRACT

A system for determining the value of an angle represented by first and second analog signals having amplitudes which are a function of the SIN and COS of the angle. The SIN and COS signals are full wave demodulated in such a manner that the demodulated signals are always of opposite polarity and the smaller of the two signals is continuously integrated in an integrator while the larger of the two signals is sample data integrated in the integrator to maintain the output of the integrator within predefined upper and lower limits. Angle computation is then performed as a function of the ratio of the number of complete half cycles of the demodulated signals during a fixed time interval plus the change in the output of the integrator since the previous time interval.

9 Claims, 7 Drawing Figures

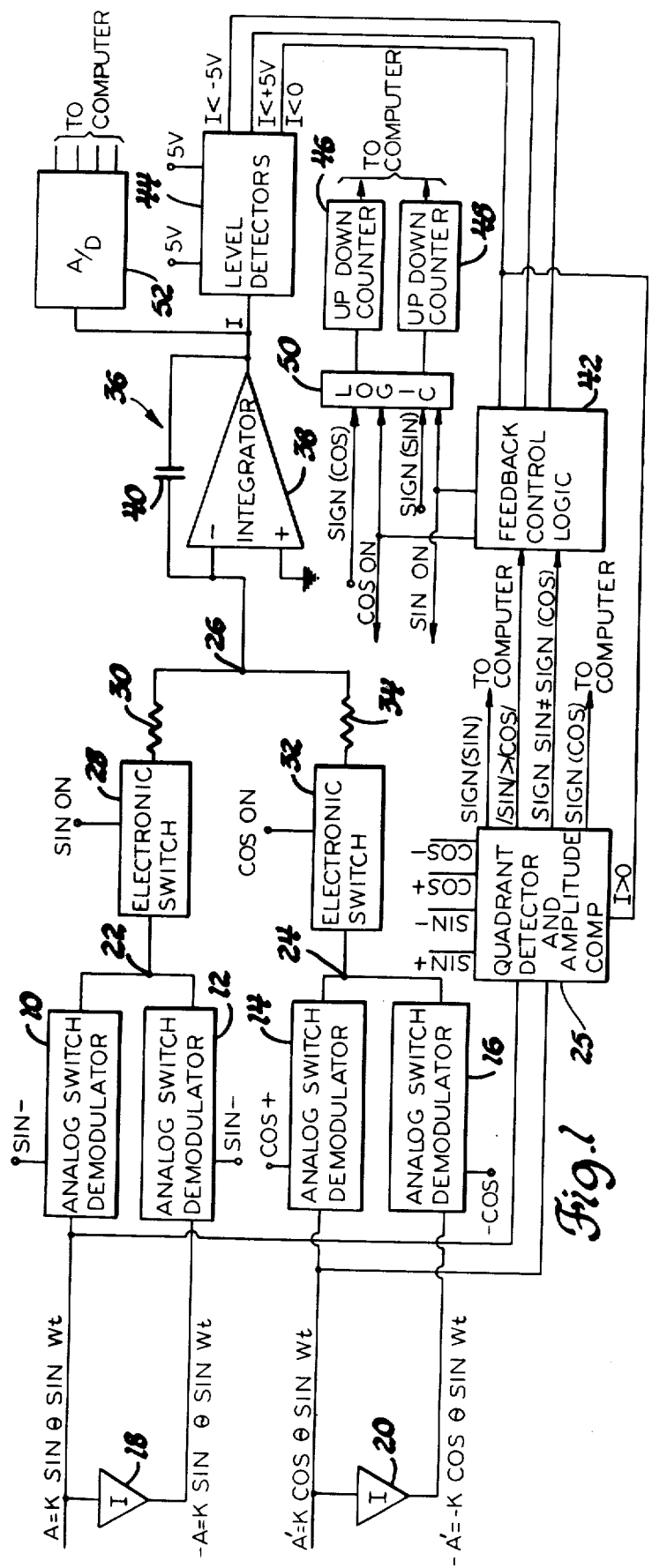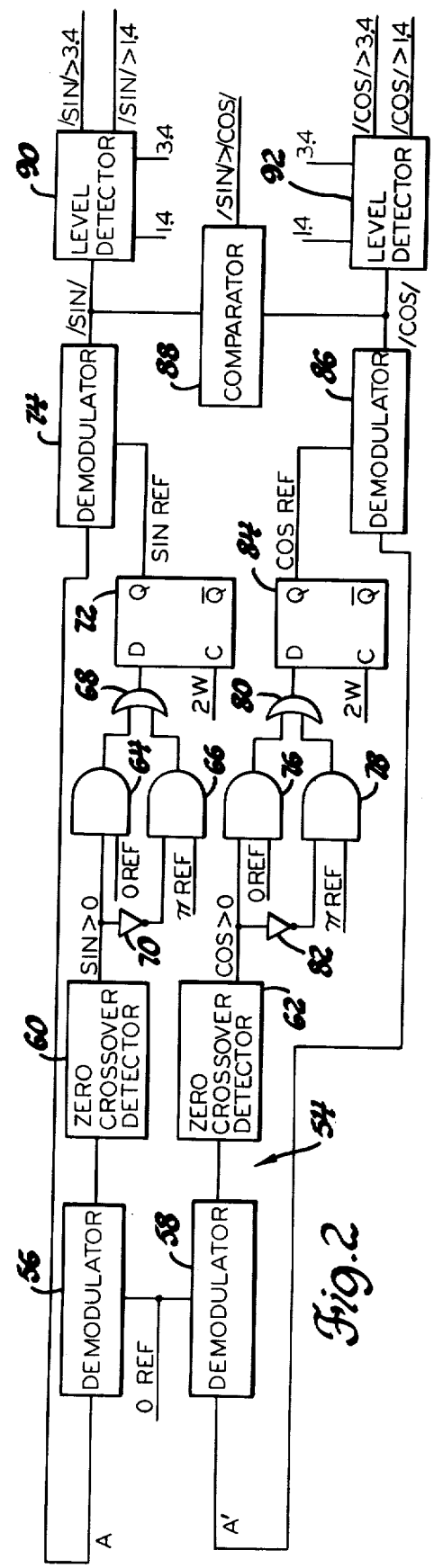
Fig. 1
Fig. 2

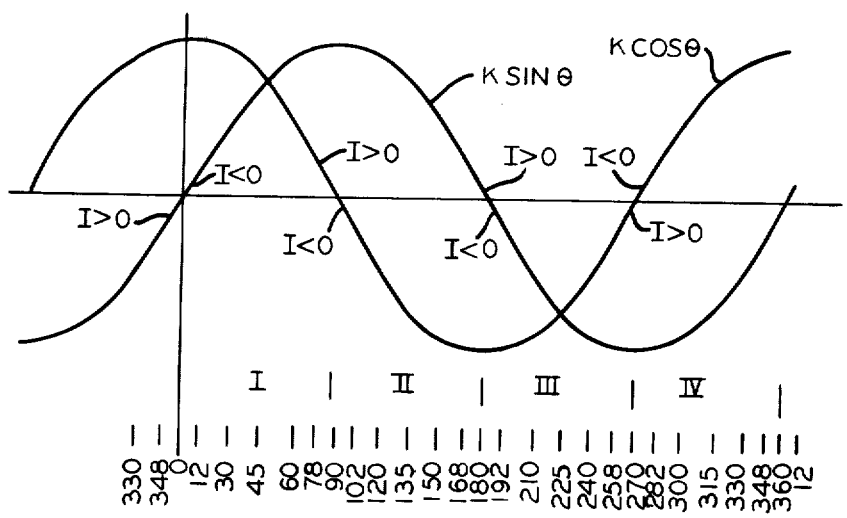
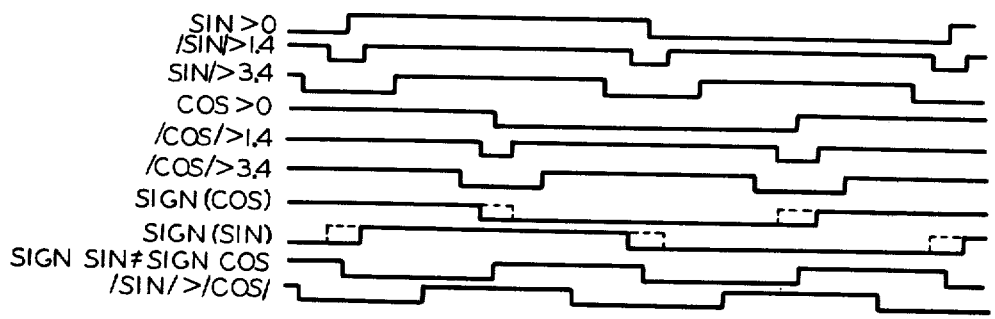
*Fig. 3*
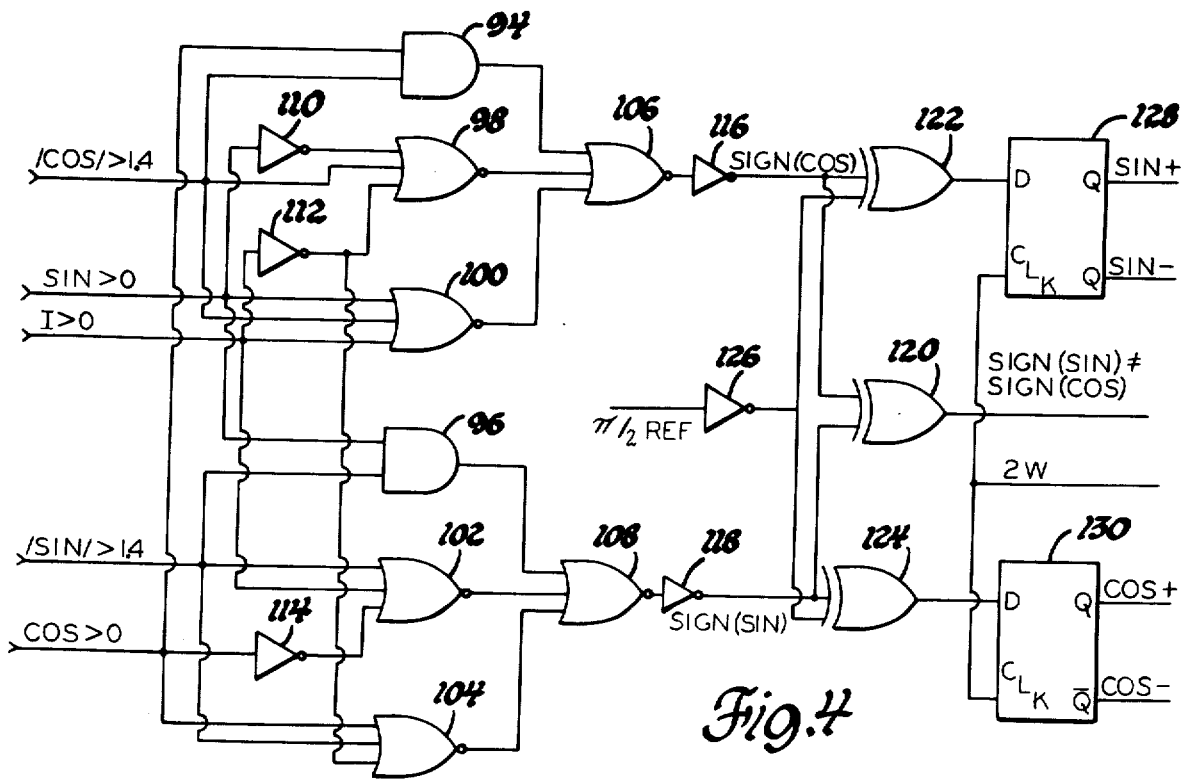
*Fig. 4*

| SIN+ | COS+ | DEMODULATED SIN FUNCTION | DEMODULATORS COS FUNCTION | DEMODULATORS CONTROLLED BY | θ | SUMMING MODE |
|---|---|---|---|---|---|---|
| 0 REF. | π REF. | | | INTEGRATOR | 0<br>12 | INTEGRATE SIN SAMPLE COS AT INTEGRATOR ±5V LIMITS |
| | | | | COURSE QUADRANT IDENTIFIER | 30<br>60 | INTEGRATE SIN+COS BLANK COS AT INTEGRATOR +5V LIMIT BLANK SIN AT INTEGRATOR −5V LIMIT |
| π REF. | π REF. | | | INTEGRATOR | 78<br>90<br>102 | INTEGRATE COS SAMPLE SIN AT INTEGRATOR ±5V LIMITS |
| | | | | COURSE QUADRANT IDENTIFIER | 120<br>150 | INTEGRATE SIN+COS BLANK SIN AT INTEGRATOR +5V LIMIT BLANK COS AT INTEGRATOR −5V LIMIT |
| π REF | 0 REF. | | | INTEGRATOR | 168<br>180<br>192 | SAME AS 0°–30° |
| | | | | COURSE QUADRANT IDENTIFIER | 210<br>240 | SAME AS 30°–60° |
| 0 REF. | 0 REF. | | | INTEGRATOR | 258<br>270<br>282 | SAME AS 60°–120° |
| | | | | COURSE QUADRANT IDENTIFIER | 300<br>330 | SAME AS 120°–150° |
| | | | | INTEGRATOR | 348<br>360 | SAME AS 0°–30° |

Fig. 5

ANALOG TO DIGITAL CONVERTER FOR PROVIDING THE DIGITAL REPRESENTATION OF AN ANGLE

This invention relates generally to analog to digital converters and more particularly to angle readout circuitry responsive to analog input signals which vary in amplitude as a function of the sine and cosine of the angle for developing a highly accurate digital representation of the angle.

Analog to digital converters which provide a digital representation of angle $\theta$ based on SIN $\theta$ and COS $\theta$ input signals are well known in the art. See for example the patents to Brand et al U.S. Pat. Nos. 3,829,854, Ivers 3,641,565, Higgins et al 3,713,141 and Sacks et al 3,516,084. In general the prior art conversion techniques are either not very accurate or if highly accurate require too much hardware for practical application.

In accordance with the present invention, improved angle readout circuitry is provided which is based on the ratio of the trigonometrically related input signals. More particularly the SIN $\theta$ and COS $\theta$ input signals are demodulated in a manner to ensure that the demodulated signals are always of opposite polarity. The smaller of the demodulated signals is then continuously integrated while the larger of the demodulated signals is sample data integrated as required to maintain the output of the integrator between predefined upper and lower limits.

In view of the foregoing, one object of the present invention is to provide an improved apparatus for converting analog angle data into a digital representation thereof.

It is another object of the present invention to provide a highly accurate digital output representing the ratio between two analog input signals which bear a known relationship one to the other.

It is another object of the present invention to provide a highly accurate analog to digital converter in which SIN $\theta$ and COS $\theta$ input signals are full wave rectified and applied to an integrator with the ratio of the number of complete half cycles of the smaller input to the number of complete half cycles of the larger input being controlled by the integrator output to maintain the integrator in a nulling mode.

These and other objects of the present invention will be more apparent from the following detailed description which should be read in conjunction with the drawings in which:

FIG. 1 is a block diagram of the apparatus of the present invention;

FIG. 2 is a more detailed block diagram of a portion of the system shown in FIG. 1;

FIGS. 3 and 5 are charts useful in explaining the operation of the system of the present invention; and FIGS. 4, 6 and 7 are more detailed logic diagrams of portions of the system.

Figure 6:
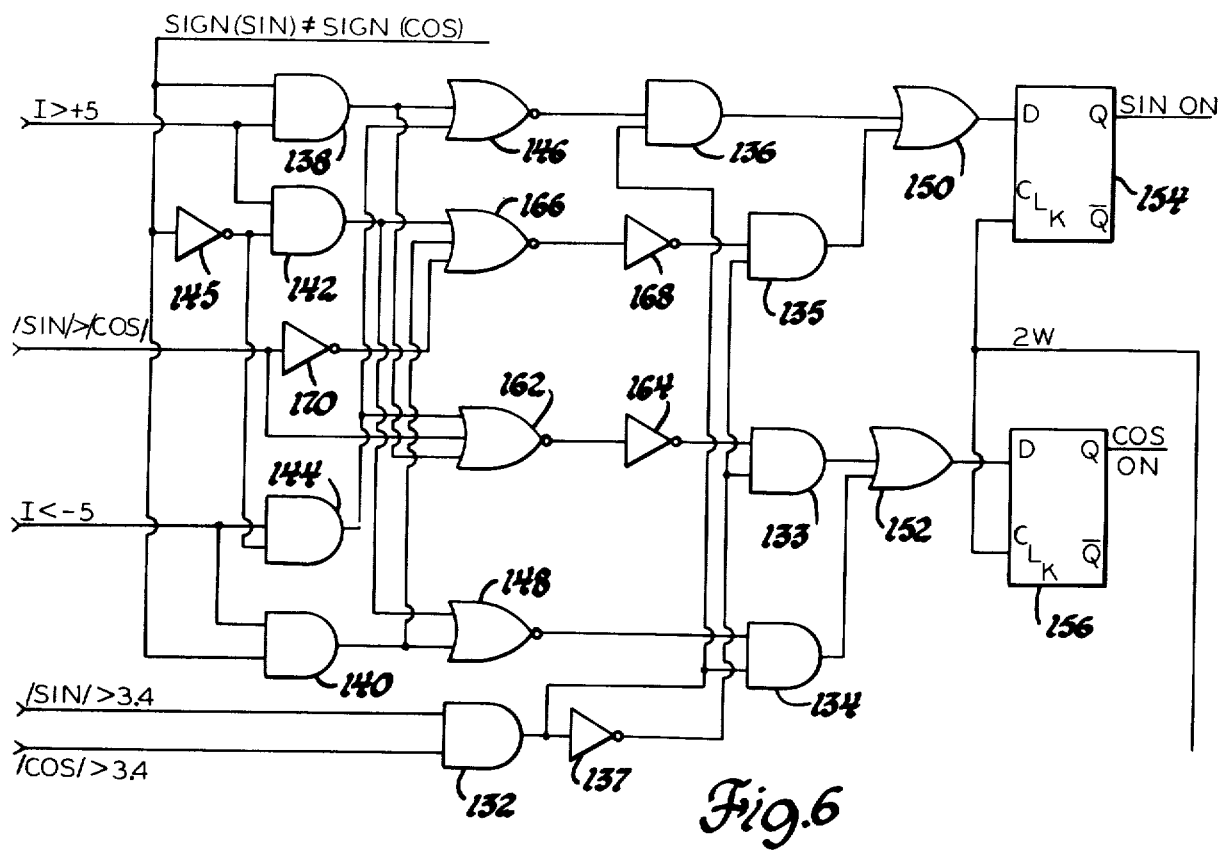

Referring now to the drawings and initially to FIG. 1, analog switch demodulators 10, 12, 14 and 16 demodulate the input signals applied thereto. The demodulators 10-16 are basically solid state switches, such as an FET, which is closed and opened in response to a control signal. The signals A and A' are applied to the demodulators 10 and 14 respectively while the signals $-A$ and $-A'$ are applied to the demodulators 12 and 16. The signals A and A' are sinusoidal signals of frequency $\omega$ with an amplitude K SIN $\theta$ and K COS $\theta$ respectively. The amplitude of the sine waves A, $-A$, A' and $-A'$ are thus dependent upon the angle $\theta$. The signals $-A$ and $-A'$ may be obtained from inverting amplifiers 18 and 20 and are 180° out of phase with the signals A and A' respectively.

The demodulators are controlled by signals designated SIN+, SIN−, COS+ and COS− respectively. These control signals are either in phase or 180° out of phase with the input signals. The signal A is demodulated as a function of the sign of A'. When $\theta$ is in the first or fourth quadrants (COS function positive), A is demodulated by a zero phase reference signal and when $\theta$ is in the second or third quadrants (COS function negative), A is demodulated by a $\pi$ phase reference signal. A' is demodulated as a function of the inverse of the sign A in order to ensure that the demodulated signals are always of opposite polarity regardless of $\theta$. Thus when $\theta$ is in the first or second quadrant (SIN function positive), A' is demodulated by a $\pi$ phase reference signal and when $\theta$ is in the third or fourth quadrant (SIN function negative), A' is demodulated by a zero phase reference signal. The signals $-A$ and $-A'$ are always demodulated by a reference signal which is 180° out of phase with the reference signal used to demodulate A and A' respectively so as to produce full wave demodulated signals at the junctions 22 and 24. This demodulation approach produces a positive output at junction 22 when $\theta$ is in the first or third quadrants and a negative output when $\theta$ is in the second or fourth quadrants. Conversely, the junction 24 is negative when $\theta$ is in the first or third quadrants and positive when $\theta$ is in the second or fourth quadrants. The circuitry for developing the phase reference signals SIN+, SIN−, COS+ and COS− is generally designated 25 and includes quadrature detection circuitry which will be described in greater detail hereinafter.

The full wave demodulated signal appearing at the junction 22 is applied to a summing junction 26 through an electronic switch 28 and a precision resistor 30. The full wave demodulated signal appearing at the junction 24 is applied to the summing junction 26 through an electronic switch 32 and a precision resistor 34. The summing junction 26 is applied to an integrator generally designated 36 which comprises an amplifier 38 and a capacitor 40. The summing junction 26 is connected with the inverting input of the amplifier 38 while the noninverting input is grounded. The input of the integrator 36 is therefore inverted during the integration process.

As previously indicated the smaller of the signals at the junctions 22 and 24 is applied to the integrator 36 on a continuous basis and the larger of the signals at the junctions 22 and 24 is applied as necessary to maintain the integrator output within predefined limits. Application of the signals at the junctions 22 and 24 to the integrator 36 is controlled by the electronic switches 28 and 32 which in turn are controlled by control signals designated SIN-ON and COS-ON. When SIN-ON is logic 1 the signal at the junction 22 is applied to the integrator 36 and when SIN-ON is logic 0 the signal at the junction 22 is prevented from reaching the integrator 36. Likewise when the signal COS-ON is logic 1 the signal at the junction 24 is applied to the integrator 36 and when the COS-ON is logic 0 the signal at the junction 24 is prevented from reaching the integrator 36. Logic for developing the signals SIN-ON and COS-ON is generally designated 42 and responds to the output of level detectors generally designated 44 which produce logic level output signals dependent on the magnitude and direction of the integrator output I. Other inputs to the logic 42 are from the block 25 which responds to the amplitude of the signals A and A' to develop logic level signals identifying which of the signals is the largest and whether the larger signal is positive or negative.

Knowing the absolute values as well as the polarity of the signals A and A' and the level of the integrator output, sufficient information is available to control the switches 28 and 32 to maintain the integrator output between upper and lower predefined limits. The angle $\theta$ is obtained by clocking up/down counters 46 and 48 by a $2\omega$clock signal through logic 50 which is controlled by the SIN-ON and COS-ON signals. The analog output of the integrator 36 is converted to a digital value by A/D converter 52. The number of counts in the counters 46 and 48 along with the output of A/D converter 52 are periodically accessed by a computer which computes the precise angle $\theta$ based on the arc tangent of the ratio of the smaller counter content plus the integrator output, to the larger counter content.

Referring now to FIG. 2, the quadrant detector and amplitude comparator 25 is shown in greater detail. The signals A and A' are applied to a course quadrant identifier generally designated 54. The quadrant identifier 54 comprises demodulators 56 and 58, responsive to 0 phase reference control signals, and zero crossover detectors 60 and 62. The quadrant identifier 54 produces output signals designated SIN>0 and COS>0. The demodulators 56 and 58 are identical and may suitably comprise an operational amplifier and a filter. The amplifier performs either a voltage follower or an inverter function under the control of the reference signal. If $\theta$ is in quadrant one or two the input to the demodulator 56 is in phase with the reference signal and therefore the filtered output of the amplifier will be positive. IF the $\theta$ is in quadrant three or four the input to demodulator 56 is out of phase with the reference input and therefore the filtered output of the amplifier will be negative. Thus as shown in FIG. 3 the output of the detector 60 will be a logic 1 when $\theta$ is in the first or second quadrant and a logic 0 when the $\theta$ is in the third or fourth quadrant. The output of the detector 60 is applied to logic circuitry comprising AND gates 64 and 66, OR gate 68, inverter 70, and flip-flop 72. If $\theta$ is in the first or second quadrant the gate 64 is enabled and the 0 REF signal appears at the output of flip-flop 72 designated SIN REF. If $\theta$ is in the third or fourth quadrant the gate 66 is enabled and the $\pi$ REF signal appears at the output of flip-flop 72. The signal A is also applied to demodulator 74 which is controlled by SIN REF. The demodulator 74 is identical to the demodulator 56. Since SIN REF changes from 0 REF to $\pi$ REF at the crossover points of the A signal, the output of the demodulator 74 is the absolute value of the A signal and is designated |SIN|.

The demodulator 58 and level detector 62 produce an output signal which is a logic 1 when $\theta$ is in the first or fourth quadrant and a logic 0 when $\theta$ is in the second or third quadrant. The output of the detector 62 is applied to logic comprising AND gates 76, 78, OR gate 80, inverter 82 and flip-flop 84 to produce an output signal designated COS REF which switches between 0 REF and $\pi$ REF at the crossover point of the input signal A' to produce a phase reference signal which is in phase with the A' signal when $\theta$ is in the first and fourth quadrants and is out of phase with the A' signal when $\theta$ is in the second or third quadrant. Demodulator 86 is identical with demodulator 74 and produces an output which is the absolute value of the A' signal and is designated |COS|. The outputs of the demodulators 74 and 86 are compared in comparator 88 to produce an output, as shown in FIG. 3. The outputs of demodulators 74 and 86 are also applied to level detectos 90 and 92 having 1.4 volts and 3.4 volts reference inputs. The detectors 90 and 92 provide logic 1 outputs when the absolute value of A or A' exceed 2 and 5 volts on a peak level basis (assuming that K=10 volts). For example, as shown in FIG. 3, if the angle $\theta$ is between 30° and 150° then the output signal designated |SIN|>3.4 volts is logic 1.

The quadrant identification provided by the detectors 60 and 62 becomes unreliable as the peak value of A or A' approach 0. This occurs for the signal A where the angle $\theta$ is approximately 0 or 180° and for the signal A' when the angle $\theta$ is approximately 90° or 270° as shown in FIG. 3. However, the integrator output provides a reliable determinate of the quadrant in those areas where the peak values of A and A' approach 0. Furthermore, when A approaches 0, A' is at a maximum and when A' approaches 0, A is at a maximum. These characteristics are utilized in the logic of FIG. 4 to obtain a precise quadrant determination. The logic in FIG. 4 includes AND gates 94 and 96, NOR gates 98-108 and inverters 110-118. If |SIN|>1.4 is logic 1, i.e., $\theta$ is at least 12° removed from the 0° and 180° crossover points as shown in FIG. 3, then the gate 96 is enabled and the quadrant identification is based on the SIN>0 input, i.e., the output of detector 60. Thus the output of the inverter 118 will be logic 1 if SIN>0 is logic 1, i.e., if $\theta$ is in quadrants one or two. The output of inverter 118 will be logic 0 if $\theta$ is in quadrants three or four. If the signal |COS|>1.4 is logic 1, i.e., $\theta$ is at least 12° removed from the 90° and 270° crossover points as shown in FIG. 3, then the gate 94 is enabled and quadrant identification is based on the COS>0 input, i.e, the output of the detector 62. Thus the output of the inverter 116 will be logic 1 if COS>0 is logic 1, i.e., if $\theta$ is in quadrants one or four. The output of inverter 116 will be logic 0 if $\theta$ is in quadrants two or three. The output of inverter 118 is designated SIGN (SIN) and the output of inverter 116 is designated SIGN (COS).

If the signal |COS|>1.4 is a logic 0, i.e., $\theta$ is within 12° of the 90° or 270° crossover points, then gate 94 is disabled and gates 98 and 100 are enabled. If SIN>0 is logic 1 as when $\theta$ is within 12° of the 90° crossover then if I>0 is logic 1, SIGN (COS) will be logic 1 indicating that $\theta$ is in quadrant I rather than II. If SIN>0 is logic 0 as when $\theta$ is within 12° of the 270° crossover point then if I>0 is logic 1, SIGN (COS) will be logic 1 indicating that $\theta$ is in quadrant IV rather than III.

If |SIN|>1.4 is logic 0, i.e., $\theta$ is within 12° of the 0° or 180° crossover points, then the gate 96 is disabled and the gates 102 and 104 are enabled. If COS>0 is a logic 1 as when $\theta$ is within 12° of the 0° crossover then if I>0 is logic 0, SIGN (SIN) will be logic 1 indicating that $\theta$ is in quadrant I rather than IV. If COS>0 is logic 0 as when $\theta$ is within 12° of the 180° crossover then if I>0 is logic 1, SIGN (SIN) will be logic 1 indicating that $\theta$ is in quadrant II rather than III. Thus, SIGN (SIN) is logic 1 when $\theta$ is in the first or second quadrant and logic 0 when $\theta$ is in the third or fourth quadrant. Also, SIGN (COS) is logic 1 when $\theta$ is in the first or fourth quadrant and logic 0 when $\theta$ is in the second or third quadrants.

The SIGN (COS) and SIGN (SIN) outputs provide inputs to an EXCLUSIVE OR gate 120 the output of which is designated SIGN (SIN)$\neq$SIGN (COS) and is logic 1 when θ is in the second or fourth quadrant (inputs are at different logic levels) and is logic 0 when θ is in the first or third quadrants (inputs are at the same logic levels).

The SIGN (COS) and SIGN (SIN) outputs also provide one input to EXCLUSIVE OR gates 122 and 124 respectively. The other input to gates 122 and 124 is π/2 REF inverted by inverter 126. The outputs of the gates 122 and 124 provide inputs to flip-flops 128 and 130 respectively which are clocked from 2ω. The outputs of the flip-flops 128 and 130 are the aforementioned SIN+, SIN−, COS+ and COS− demodulator control signals. As previously mentioned the SIN+ signal is in phase with A when θ is in the first and fourth quadrants (COS function is positive) and is out of phase with A when θ is in the second or third quadrants (COS function is negative). The COS+ signal is in phase with A' when θ is in the third or fourth quadrant (SIN function is negative) and is out of phase with A' when 2θ is in the first or second quadrant (SIN function is positive). The phase of the SIN+ and COS+ control signals as well as the controlling factor, whether integrator output or course quadrant identifier, is charted in FIG. 5 as a function of angle θ. FIG. 5 also shows the polarity of the demodulated SIN and COS functions.

The feedback control logic 42 is shown in detail in FIG. 6. The particular summing mode established by the logic of FIG. 6 as a function of θ is charted in FIG. 5. Referring to FIGS. 3 and 5, when θ is between 330° and 30° or between 150° and 210° the absolute value of the SIN function is substantially smaller then the absolute value of the COS function and accordingly the SIN function is continuously integrated until the integrator output exceeds ±5 volt limits at which time the COS is sampled. When 2θ is between 60° and 120° or between 240° and 300° the absolute value of COS function is substantially smaller then the absolute value of the SIN function and accordingly the COS function is continuously integrated until the integrator output exceeds the ±5 volts limits at which time the SIN function is sampled. When θ is 30°-60°, 120°-150°, 210°-240° or 300°-330° the absolute values of the SIN and COS functions are both greater than 3.4 volts and are approximately the same. At these angular orientations the SIN and COS functions are continuously summed until the integrator output exceeds ±5 volts at which time the larger of the two signals is blanked.

Referring now to FIG. 6 the logic for establishing the particular mode indicated in FIG. 5 includes an AND gate 132 which enables AND gates 134 and 136 when |SIN|>3.4 and |COS|>3.4 are both logic 1, i.e., when the absolute value of both the SIN and COS inputs is greater than 3.4 volts. At the same time gates 133 and 135 are disabled through inverter 137. If θ is between 120° and 150° or between 300° and 330° AND gates 138 and 140 are enabled by SIGN (SIN)≠SIGN (COS). The integrator output will be positive going if the SIN function is the larger signal and negative going if the COS function is the larger signal. As long as the integrator output is between ±5 volts the output of the gates 138, 140, 142 and 144 are logic 0 and accordingly the outputs of the gates 146 and 148 are logic 1. The outputs of the gates 134, 136, 150 and 152 are thus logic 1. Accordingly the outputs of flip-flops 154 and 156 designated SIN-ON and COS-ON respectively are both logic 1. With SIN-ON and COS-ON both logic 1 the switches 28 and 32 (FIG. 1) are both closed. Accordingly, the SIN and COS signals are summed together and integrated. If the integrator output exceeds +5 volts the output of the gate 138 switches to logic 1 producing a logic 0 at the input to flip-flop 154. SIN-ON is then clocked to logic 0 to open the switch 28. Thus, the SIN input signal is blanked for one complete cycle of the 2ω which is one-half cycle of the SIN input signal. Blanking the SIN signal resets the integrator 36 so that I> +5 becomes logic 1. If the integrator output exceeds 5 volts in the negative direction the output at gate 140 switches to logic 1. COS-ON is then clocked to logic 0 to disable the switch 32 and thereby blank the COS signal for one-half cycle and reset the integrator 36 so that I>5 volts becomes logic 0. Thus, as indicated in FIG. 5, when θ is 120°-150° or 300°-330° the SIN and COS signals are summed together and integrated until the positive integrator limit is reached at which time the SIN is blanked or until the negative integrator limit is reached at which time the COS is blanked. If θ is 30°-60° or 210°-240° the signal SIGN (SIN)≠SIGN (COS) disables the gates 138 and 140 and enables the gates 142 and 144 through inverter 145. The integrator output will be positive going if the COS function is the larger signal and negative going if the SIN function is the larger signal. If the integrator output exceeds +5 volts the input to flip-flop 156 is switched to logic 0 through gates 142, 148, 134 and 152 and COS-ON is clocked to logic 0 to disable the switch 32 and blank the COS signal. If the integrator output exceeds −5 volts the input to flip-flop 154 is switched to logic 0 through gates 144, 146, 136 and 150 and SIN-ON will be clocked to logic 0 to blank the SIN signal. This is summarized in the chart in FIG. 5 by indicating that when θ is 30°-60° or 210°-240° the SIN and COS signals are summed together and integrated until the positive integrator limit is reached at which time the COS is blanked or until the negative integrator limit is reached at which time the SIN is blank.

If either |SIN|>3.4 or |COS|>3.4 are logic 0 the gates 133 and 135 are enabled and gates 134 and 136 are disabled. This will coincide with a θ of 330°-30°, 60°-120°, 150°-210° or 240°-300° as indicated in the charts in FIGS. 3 and 5. If |SIN|>|COS| is logic 1, i.e., θ is 60°-120° or 240°-300° then the output of NOR gate 162 will be logic 0 and the input to flip-flop 156 will be logic 1 through inverter 164 and gates 133, 152. COS-ON will then be switched to logic 1 so that the smaller of the two signals, namely the COS signal, is fed through the switch 32 to the integrator 36. SIN-ON will be switched from logic 0 to logic 1 when the integrator output exceeds +5 volts. This will occur if the angle θ is in the first or third quadrants, i.e. 60°-90° or 240°-270°. Under these circumstances SIGN (SIN)-≠SIGN (COS) is logic 0 disabling the gates 138 and 140 and enabling the gate 142. When the integrator output exceeds 5 volts the output of gate 142 switches to logic 1 as does the input of flip-flop 154 through gate 166, inverter 168, and gates 135, 150. SIN-ON will also be switched from logic 0 to logic 1 when the integrator output falls below −5 volts. This will occur if the angle 2θ is in the second or fourth quadrant, i.e., 90°-120° or 270°-300°. Under these circumstances the output of the gate 140 switches to logic 1 as does the input to flip-flop 154 through gate 166, inverter 168 and gates 135, 150. If 2θ is 330°-30° or 150°-210° then |SIN|>|COS| is logic 0 which switches the input to flip-flop 154 to logic 1 through inverter 170, gate 166, inverter 168 and gates 135, 150. On the following 2ω clock pulse SIN-ON is switched to logic 1 so that the smaller of the signals, namely the SIN signal, is fed through the switch 28 to the integrator 36. COS-ON will be switched from logic 0 to logic 1 when the integrator output exceeds −5 volts. This will occur if the angle θ is in the first or third quadrants, i.e., 0°-30° or 180°-210°. Under these circumstances SIGN (SIN) ≠ SIGN (COS) is logic 0 enabling gate 144 through inverter 145, causing the output of gate 162 to switch to logic 0 when I > −5 becomes logic 1. When gate 162 switches to logic 0, COS-ON will be switched to logic 1 by the 2ω clock. COS-ON will also be switched to logic 1 when the integrator exceeds +5 volts. This will occur if the angle 2θ is in the second or fourth quadrants, i.e., 150°-180° or 330°-360°. Under these circumstances SIGN (SIN) ≠ SIGN (COS) is logic 1 enabling gate 138 causing the output of gate 162 to switch to logic 0 when I > +5 becomes logic 1. COS-ON then switches to logic 1 on the next 2ω clock pulse.

The SIN-ON and COS-ON logic signals may be utilized in conjunction with the SIN+, SIN−, COS+ and COS− phase reference signals so that whenever the SIN function is being applied to the integrator 36 the demodulators 14 and 16 are both turned off to further ensure that the COS function is removed from the input of the integrator 36. Similarly when the COS function is applied to the integrator 36 the demodulators 10 and 12 may be switched off to further ensure that the SIN function is decoupled from the integrator input.

Figure 7:
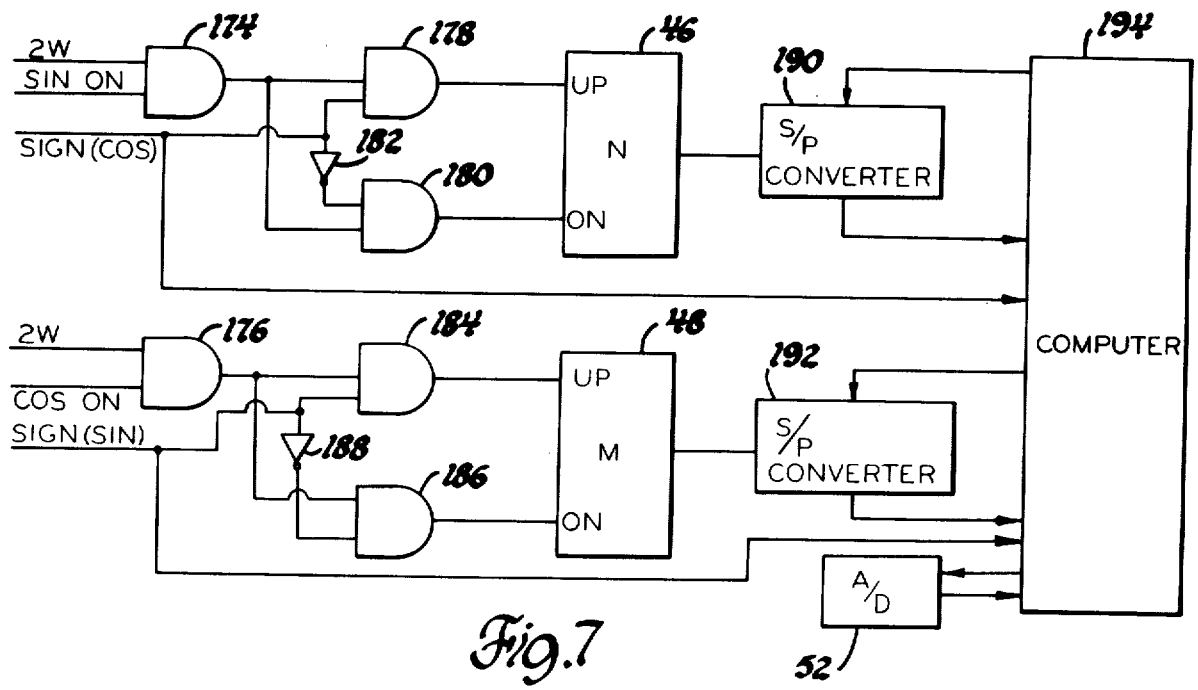

Referring now to FIG. 7 the application of the 2ω clock pulses to counters 46 and 48 through gates 174 and 176 is controlled by the signals SIN-ON and COS-ON respectively. Whether the counters 46 and 48 count up or down is controlled by the signals SIGN (COS) and SIGN (SIN) through gates 178, 180, inverter 182 and gates 184, 186, inverter 188 respectively. Counter 46 designated N counts up if the pattern is in the first or fourth quadrants and counts down if the pattern is in the second or third quadrant. Counter M counts up if the pattern is in the first or second quadrant and counts down if the pattern is in the third or fourth quadrant. The content of the counters N and M is converted from serial to parallel data in converter 190 and 192 and is accessed, each computational interval, by a computer generally designated 194 which performs an arc tangent routine using the smaller content of the two counters as the numerator and the larger content of the two counters as the denominator. This ratio along with the inputs SIGN (COS) and SIGN (SIN) which identify the quadrant, provide sufficient information to compute a first order approximation of θ. This approximation may be further defined by utilizing the change (Δ I) in the integrator output during the computational interval. Further definition can be had by taking into consideration rate inputs and computer time errors. The computation carried out by the computer is in accordance with the following equation:

$$\tan \tilde{\theta}_K \simeq \frac{A_K}{B_K} + $$

$$\frac{C_K^* f_c (I_K - I_{K-1}) \left[ 1 + \frac{N_{K-1}^2}{6} \left( \frac{\tilde{\theta}_{K-1} - \tilde{\theta}_{K-2}}{N_{K-1} + N_{K-2}} \right)^2 \right]}{N_K \cos \left[ \tilde{\theta}_{K-1} + \frac{(\theta_{K-1} - \theta_{K-2}) N_K + N_{K-1}}{(N_{K-1} + N_{K-2})} \right]}$$

where: $\tilde{\theta}_K$ = average angle during $K^{th}$ computational cycle $$A_K = \begin{cases} M_K & \text{when } /M_K/ \leq /n_K/ \\ n_K & \text{when } /n_K/ \leq /M_K/ \end{cases}$$

$$B_K = \begin{cases} M_K & \text{when } /n_K/ \leq /M_K/ \\ n_K & \text{when } /M_K/ \leq /n_K/ \end{cases}$$

$M_K$ = number of cosine half waves integrated during the $K^{th}$ computational cycle
$n_K$ = number of sine half waves integrated during the $K^{th}$ computational cycle
$N_K$ = number of carrier half waves which occurred during the $K^{th}$ computational cycle
$f_c$ = carrier frequency $$C_K^* = \begin{cases} +1 & \text{when } A_K = n_K \\ -1 & \text{when } A_K = M_K \end{cases}$$

The whole angle ($\theta_K$) ranges from $-\pi/4$ to $+7\pi/4$ per the following equations $$\tilde{\theta}_K = \tilde{\theta}_K \text{ when } B_K = n_K \text{ and } n_K \text{ is positive}$$

$$= \pi + \tilde{\theta}_K \text{ when } B_K = n_K \text{ and } n_K \text{ is negative}$$

$$= \frac{\pi}{2} - \tilde{\theta}_K \text{ when } B_K = M_K \text{ and } M_K \text{ is positive}$$

$$= \frac{3\pi}{2} - \tilde{\theta}_K \text{ when } B_K = M_K \text{ and } M_K \text{ is negative}$$

Having thus described my invention what I claim is:

1. Apparatus for determining the ratio of first and second sinusoidal analog signals having amplitudes which vary as a function of a variable comprising:
   signal conditioning means responsive to said signals for developing first and second conditioned signals which are of opposite polarity regardless of said variable,
   means for continuously integrating the smaller of said conditioned signals and sample data integrating the larger of said conditioned signals to maintain the output of the integratng means between predefined upper and lower limits,
   means for computing said variable as a function of the ratio of the number of complete half cycles of said first and second conditioned signals applied to said integrating means during a fixed time interval.

2. A system for determining the value of an angle represented by first and second sinusoidal input signals having amplitudes which are a function of the sine and cosine respsectively of the angle comprising:
   means for full wave demodulating said signals so that the demodulated sine signal is of opposite polarity to the demodulated consine signal regardless of said angle,
   integrating means comprising an analog integrator, first electronic switch means for applying said demodulated sine signal to the input of said analog integrator, second electronic switch means for applying said demodulated cosine signal to the input of said integrator, control logic responsive to the output of said analog integrator and to the absolute value of the amplitude of said input signals for producing first and second switch control signals for controlling said first and second electronic switch means respectively to continuously apply the smaller of said demodulated signals to the input of said analog integrator while applying the number of complete half cycles of said larger of said demodulated signals to the input of said analog integrator as required to maintain the output of said analog integrator within upper and lower limits, means for computing said angle as a function of the ratio of the number of complete half cycles of said demodulated sine and said demodulated cosine signals applied to said analog integrator during a fixed time interval plus the change in the amplitude of the output of the integrator since the previous time interval.

3. A system for determining the value of an angle represented by first and second sinusoidal input signals having amplitudes which are a function of the sine and cosine respectively of the angle comprising:

means for full wave demodulating said signals so that the demodulated sine signal is of opposite polarity to the demodulated cosine signal regardless of said angle, integrating means comprising an analog integrator, first electronic switch means for applying said demodulated sine signal to the input of said analog integrator, second electronic switch means for applying said demodulated cosine signal to the input of said integrator, control logic responsive to the output of said analog integrator and to the absolute value of the amplitude of said input signals for producing said first and second switch control signals for controlling said first and second electronic switch means respectively to continuously apply the smaller of said demodulated signals to the input of said analog integrator while applying the number of complete half cycles of said larger of said demodulated signals to the input of said analog integrator required to maintain the output of said analog integrator within upper and lower limits, first and second counter means for respectively counting the number of complete half cycles of the demodulated sine and demodulated cosine signals applied to said analog integrator during a fixed time interval, means for computing said angle as a function of the ratio of the content of the counter means having the lower content plus the change in the amplitude of the output of said analog integrator since the previous time interval to the content of the counter means having the higher content.

4. A system for determining the value of an angle represented by first and second sinusoidal input signals having amplitudes which are a function of the sine and cosine respectively of the angle comprising:

means for full wave demodulating said sine input as a function of the sign of the cosine input and for full wave demodulating said cosine input as a function of the sign of the sine input so that the demodulated signals are of opposite polarity regardless of said angle, means for continuously integrating the smaller of said demodulated signals and sample data integrating the larger of said demodulated signals to maintain the output of the integrating means between predefined upper and lower limits, means for computing said angle as a function of the ratio of the number of complete half cycles of said demodulated sine and said demodulated cosine signals applied to said integrating means during a fixed time interval.

5. A system for determining the value of an angle represented by first and second sinusoidal input signals having amplitudes which are a function of the sine and cosine respectively of the angle comprising:

means for full wave demodulating said sine input to produce a positive output when said angle is in the first or third quadrant and a negative output when said angle is in the second or fourth quadrant and for full wave demodulating said cosine input to produce a negative output when said angle is in the first or third quadrant and a positive output when said angle is in the second or fourth quadrant, means for continuously integrating the smaller of said demodulated signals and sample data integrating the larger of said demodulated signals to maintain the output of the integrating means between predefined upper and lower limits, means for computing said angle as a function of the ratio of the number of complete half cycles of said demdolated sine and said demodulated cosine signals applied to said integrating means during a fixed time interval plus the change in the amplitude of the output of the integrating means since the previous time interval.

6. The system defined in claim 5 wherein said means for full wave demodulating said sine and cosine inputs includes first logic means responsive to said input signals for producing a sine switch control signal related to the sign of the cosine input signal and a cosine switch control signal related to the sign of the sine input signal, said means for full wave demodulating said inputs further comprising first analog switch means responsive to said sine input and to said sine control signal for providing a demodulated sine output which is positive when said angle is in the first or third quadrant and which is negative when the angle is in the second or fourth quadrant, said means for demodulating said input signals further comprising second analog switch means responsive to said cosine input and to said cosine control signal for providing a demodulated cosine output which is negative in said first or third quadrant and positive in said second or fourth quadrant.

7. The system defined in claim 6 wherein said integrating means comprises an analog integrator, third and fourth switch means connected between said first and second switch means respectively, and feedback control logic responsive to the output of said analog integrator for producing a second sine switch control signal and a second cosine switch control signal for controlling said second and third switch means respectively to continuously apply the smaller of said demodulated signals to the input of said analog integrator while applying the requisite number of complete half cycles of the larger of said demodulated signals to the input of said analog integrator to maintain the output of said analog integrator within said upper and lower limits.

8. The system in claim 7 further comprising first and second up/down counter means for respectively counting the number of complete half cycles of the demodulated sine and demodulated cosine signals applied to said analog integrator during a fixed time interval.

9. A system for determining the value of an angle represented by first and second sinusoidal input signals having amplitudes which are a function of the sine and cosine respectively of the angle comprising:

means for full wave demodulating said sine input to produce a positive demodulated sine output when said angle is in the first or third quadrant and a negative demodulated sine output when said angle is in said second or fourth quadrant and for full wave demodulating said cosine input to produce a negative demodulated cosine output when said angle is in said first or third quadrant and a positive demodulated cosine output when said angle is in said second or fourth quadrant, integrating means comprising an analog integrator, first electronic switch means connected between said first demodulating means and the input of said analog integrator, second electronic switch means connected between said second full wave demodulating means and the input of said analog integrator, control logic responsive to said sine input and cosine input and the output of said analog integrator for producing a sine control signal and a cosine control signal for controlling said first and second electronic switch means respectively to continuously apply the smaller of said demodulated signals to the input of said analog integrator while appying the requisite number of complete half cycles of the larger of said demodulated signals to the input of said analog integrator to maintain the output of said analog integrator within said upper and lower limits, first up/down counter means responsive to said sine control signal for counting the number of half waves of said demodulated sine signal applied to said analog integrator during a fixed time interval, the direction of counting of said first up/down counter means being a function of the sign of the cosine input, second up/down counter means responsive to said cosine control signal for counting the number of half waves of said demodulated cosine signal applied to the input of said analog integrator during said fixed time interval, the direction of counting of said second up/down counter means being controlled by the sign of the sine input, means for computing said angle by dividing the content of the up/down counter means having the smallest content plus the change in the amplitude of the output of said analog integrator since the previous time interval by the content of the other up/down counter means.

* * * * *